(12) United States Patent
Liu et al.

(10) Patent No.: US 9,930,284 B2
(45) Date of Patent: Mar. 27, 2018

(54) ANALOG READOUT PREPROCESSING CIRCUIT FOR CMOS IMAGE SENSOR AND CONTROL METHOD THEREOF

(71) Applicant: INSTITUTE OF SEMICONDUCTORS, CHINESE ACADEMY OF SCIENCES, Beijing (CN)

(72) Inventors: Liyuan Liu, Beijing (CN); Nanjian Wu, Beijing (CN); Zhiqiang Guo, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/538,514

(22) PCT Filed: Dec. 29, 2014

(86) PCT No.: PCT/CN2014/095254
§ 371 (c)(1),
(2) Date: Jun. 21, 2017

(87) PCT Pub. No.: WO2016/106478
PCT Pub. Date: Jul. 7, 2016

(65) Prior Publication Data
US 2017/0353685 A1 Dec. 7, 2017

(51) Int. Cl.
*H03M 1/06* (2006.01)
*H04N 5/378* (2011.01)
(Continued)

(52) U.S. Cl.
CPC ............ *H04N 5/378* (2013.01); *H03M 1/02* (2013.01); *H03M 1/1047* (2013.01); *H03M 1/468* (2013.01); *H03M 1/804* (2013.01)

(58) Field of Classification Search
CPC ........ H04N 5/378; H03M 1/468; H03M 1/02; H03M 1/1047; H03M 1/804
(Continued)

(56) References Cited

U.S. PATENT DOCUMENTS 9,754,989 B2 * 9/2017 Huang .............. H01L 27/14634
9,769,407 B2 * 9/2017 Nie ...................... H04N 5/3743
(Continued)

FOREIGN PATENT DOCUMENTS

CN 1885723 A 12/2006
CN 101662283 A 3/2010
(Continued)

OTHER PUBLICATIONS

"International Application No. PCT/CN2014/095254, International Search Report dated Mar. 2, 2015", w/ English Translation, (Mar. 2, 2015), 6 pgs.
(Continued)

*Primary Examiner* — Brian Young
(74) *Attorney, Agent, or Firm* — Schwegman Lundberg & Woessner, P.A.

(57) ABSTRACT

The present disclosure provides an analog readout preprocessing circuit for a CMOS image sensor and a control method thereof. The analog readout preprocessing circuit comprises an extended count-type integration cycle-successive approximation hybrid analog-to-digital conversion capacitor network 1 configured to achieve readout and analog-to-digital conversion of signals output from the CMOS image sensor; an operational amplifier configured to utilize "virtual short" of two input terminals of the operational amplifier and the charge conservation principle, to achieve a function of extended count-type integration cycle-successive approximation hybrid analog-to-digital conversion, where the extended count-type integration can effec-
(Continued)

tively reduce a thermal noise and a flicker noise within the image sensor; a comparator configured to compare voltages at two terminals to achieve a function of quantization of signals; and a control signal generator configured to provide control signals.

17 Claims, 3 Drawing Sheets

(51) Int. Cl.
*H03M 1/10* (2006.01)
*H03M 1/80* (2006.01)
*H03M 1/02* (2006.01)
*H03M 1/46* (2006.01)

(58) Field of Classification Search
USPC .................................................. 341/118, 155
See application file for complete search history.

(56) References Cited

U.S. PATENT DOCUMENTS 9,774,332 B2 * 9/2017 Lee ..................... H03K 21/026
9,806,113 B2 * 10/2017 Oh .................... H01L 27/14614
2011/0260899 A1 10/2011 Snedeker

FOREIGN PATENT DOCUMENTS

CN 102163973 A 8/2011
CN 103905750 A 7/2014

OTHER PUBLICATIONS

"International Application No. PCT/CN2014/095254, Written Opinion dated Mar. 2, 2015", (Mar. 2, 2015), 4 pgs.

* cited by examiner

ANALOG READOUT PREPROCESSING CIRCUIT FOR CMOS IMAGE SENSOR AND CONTROL METHOD THEREOF

PRIORITY APPLICATIONS

This application is a U.S. National Stage Filing under 35 U.S.C. 371 from International Application No. PCT/CN2014/095254, filed on 29 Dec. 2014, and published as WO2016/106478 on 7 Jul. 2016; which application and publication are incorporated herein by reference in its entirety.

The present disclosure relates to the field of integrated circuit technology, and in particular, to an analog readout preprocessing circuit for a complementary metal-oxide-semiconductor (CMOS) image sensor and a control method thereof.

BACKGROUND

CMOS image sensors are a kind of solid state image sensors. A CMOS image sensor with a resolution of M×N generally includes an image sensor array (with a size of M×N), an analog readout processing circuit, and a digital control module etc. Among them, the analog readout processing circuit has a size of 1×P, where 1≤P≤N; wherein when P=1, it performs serial readout, has the lowest degree of parallelism, and is mainly used for a low-speed image sensor; and when P=N, it performs parallel readout for all columns, has the highest degree of parallelism, and is mainly used for a high-speed image sensor.

FIG. 1 is a structural block diagram showing a structure of a conventional analog readout processing circuit for a solid state image sensor. Referring to FIG. 1, the analog readout processing circuit comprises an analog readout preprocessing circuit and an analog-to-digital converter (ADC). The analog readout preprocessing circuit plays an important role therein. An output voltage of the image sensor is de-noised, amplified, level shifted, and converted from single-end to differential by the analog readout preprocessing circuit and is output to the ADC in a differential structure. A sampling preprocessing circuit in the ADC outputs a differential signal, quantizes the differential signal, and temporarily stores the quantized value in a register, which is prepared for outputting at an input/output (IO) port directly or after being processed in a digital domain.

In the prior art, the analog readout preprocessing circuit only samples and converts a reset signal and an effective light intensity signal output from the image sensor one time, resulting in a large readout noise and a longer analog readout time, wherein the output noise of the analog read preprocessing circuit contains a noise from the image sensor.

The analog readout preprocessing circuit according to the present disclosure comprises an extended count-type integrating circuit which can effectively reduce a thermal noise from the image sensor and circuits by integrating the reset signal and the light intensity signal output from the image sensor many times, thereby providing a signal readout with high performance.

In carrying out the present disclosure, the inventor has found that the use of the extended count-type integrating circuit requires multiple sampling of the signal, thereby increasing the readout time and lowering a readout speed, which is unfavorable for the application of the readout circuit in cases where a high speed is needed.

SUMMARY

Technical Problem to be Solved by the Present Disclosure

In order to solve the above-mentioned technical problems, the present disclosure provides an analog readout preprocessing circuit for a CMOS image sensor and a control method thereof which can not only reduce the readout noise but also minimize the analog readout time as much as possible.

Technical Solutions

In order to achieve the above object, the present disclosure provides an analog readout preprocessing circuit for a solid state CMOS image sensor, comprising:

an extended count-type integration cycle-successive approximation hybrid analog-to-digital conversion capacitor network 1 configured to acquire signals and preprocess the acquired signals to achieve extended count-type integration and analog-to-digital conversion of the signals;

an operational amplifier 2 with a positive input terminal (Vip) and a negative input terminal (Vin) connected to an output terminal of the extended count-type integration cycle-successive approximation hybrid analog-to-digital conversion capacitor network 1 and configured to utilize "virtual short" of the two input terminals of the operational amplifier and the charge conservation principle, to achieve extended count-type integration cycle-successive approximation hybrid analog-to-digital conversion;

a voltage comparator 3 with a positive input terminal ($V_{ip,cmp}$) connected to a positive output terminal of the operational amplifier 2, a negative input terminal ($V_{in,cmp}$) connected to a negative output terminal of the operational amplifier 2, and an output terminal connected to the extended count-type integration cycle-successive approximation hybrid analog-to-digital conversion capacitor network 1, and configured to achieve a voltage comparison function, and control a switch within the extended count-type integration cycle-successive approximation hybrid analog-to-digital conversion capacitor network 1;

a control signal generator 4 configured to provide a control signal to the extended count-type integration cycle-successive approximation hybrid analog-to-digital conversion capacitor network 1;

an accumulator 5 configured to accumulate an output of the voltage comparator 3 during an extended count-type integration process;

a first latch 6 configured to temporarily store an output of a first cycle-successive approximation hybrid analog-to-digital conversion, a second latch 7 configured to temporarily store an output of a second cycle-successive approximation hybrid analog-to-digital conversion; and a digital processor 8 configured to synthesize digital signals output from the accumulator 5, the first latch 6 and the second latch 7 to obtain a final digital signal corresponding to an effective light intensity signal output from the image sensor.

In order to achieve the above object, the present disclosure further provides a control method for the analog readout preprocessing circuit, comprising:

Step A where the extended count-type integrator samples a reset signal output from the image sensor;

Step B where the extended count-type integrator integrates the reset signal output from the image sensor for the first time after an sampling operation, and transfers the sampled signal to an integrating capacitor to reduce noise power of the reset signal;

Step C where the reset signal output from the image sensor is integrated fifteen times after the integration for the first time;

Step D where the effective light intensity signal output from the image sensor is integrated another sixteen times after the reset signal output from the image sensor has been integrated sixteen times;

Step E where first cycle-successive approximation hybrid analog-to-digital conversion is performed on a difference ($V_{op}$–$V_{on}$) of $V_{op}$ and $V_{on}$ at the output terminals of the amplifier after the integration of the reset signal and the effective light intensity signal has completed;

Step F where a first cycle operation is performed after the first cycle-successive approximation hybrid analog-to-digital conversion;

Step G where second cycle-successive approximation hybrid analog-to-digital conversion is performed after the first cycle operation; and Step H where a digital processor synthesizes digital signals output from the accumulator, the first latch and the second latch to obtain a final digital signal corresponding to the effective light intensity signal output from the image sensor.

Advantageous Effects

As can be seen from the above technical solutions, the analog readout preprocessing circuit for a CMOS image sensor according to the present disclosure has the following advantageous effects:

(1) As a result of the use of extended count-type integration technology, through multiple integration and average of the output signal of the image sensor, it can effectively reduce the noises from the image sensor and circuits, thereby improving the performance of the readout circuit;

(2) As a result of the use of cycle—successive approximation hybrid analog-to-digital conversion technology, it improves the readout speed; and (3) As a result of the use of operational amplifier and comparator sharing technology, it reduces the area of the preprocessing circuit.

DESCRIPTION OF REFERENCES

Figure 1:
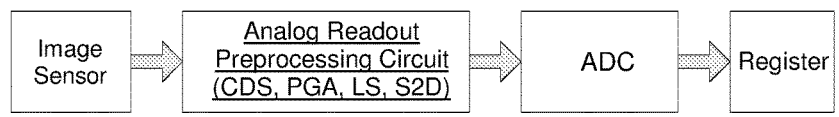
FIG. 1 is a structural block diagram of a conventional analog readout processing circuit for a solid state image sensor.

1—extended count-type integration cycle-successive approximation hybrid analog-to-digital conversion capacitor network 2—operational amplifier 3—voltage comparator
4—control signal generator
5—accumulator
6—first latch
7—second latch
8—digital processor

DETAILED DESCRIPTION

In order to make the objects, solution and advantages of the present disclosure more obvious, detailed descriptions of the present disclosure will be given below with reference to the drawings and specific embodiments. It is to be understood that the same reference signs are used for the same or identical parts in the drawings or the description. The implementations that are not shown or illustrated in the drawings are in a form known to those skilled in the art. In addition, although examples of a parameter that contains a particular value are given herein, it should be understood that the parameter needs not to be exactly equal to the corresponding value but may approximate to the corresponding value within an acceptable error tolerance or design constraint.

In an analog readout preprocessing circuit for a CMOS image sensor according to the present disclosure, an extended count-type integration cycle-successive approximation hybrid analog-to-digital conversion capacitor network uses a single operational amplifier, a voltage comparator and a switch as well as a capacitor to implement functions of analog readout and analog-to-digital conversion. The analog readout preprocessing circuit for a CMOS image sensor according to the present disclosure has different structures and corresponding different operation processes for different image sensors with different structures and different column parallelism. The specific embodiments of the present disclosure will be described in detail below with a 4-transistor active pixel image sensor having whole-column parallelism.

Figure 2:
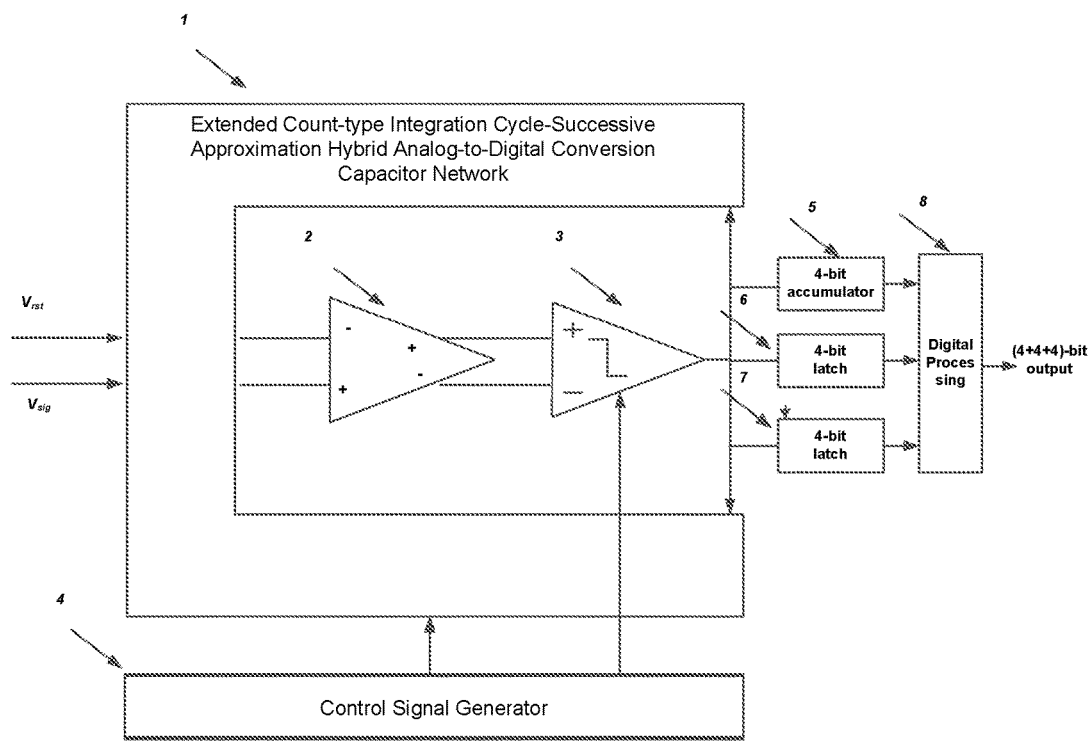
FIG. 2 is a schematic structural diagram of an analog readout preprocessing circuit for a CMOS image sensor according to an embodiment of the present disclosure.

In an exemplary embodiment of the present disclosure, there is provided an analog readout preprocessing circuit for a CMOS image sensor. FIG. 2 is a schematic structural diagram of an analog readout preprocessing circuit for a CMOS image sensor according to the present embodiment of the present disclosure. Referring to FIG. 2, the analog readout preprocessing circuit according to the present embodiment comprises an extended count-type integration cycle-successive approximation hybrid analog-to-digital conversion capacitor network 1, an operational amplifier 2, a voltage comparator 3, a control signal generator 4, an accumulator 5, a first latch 6, a second latch 7, and a digital processor 8.

The extended count-type integration cycle-successive approximation hybrid analog-to-digital conversion capacitor network 1 is configured to acquire signals and preprocess the acquired signals to achieve extended count-type integration and analog-to-digital conversion of the signals. The signals acquired by the extended count-type integration cycle-successive approximation hybrid analog-to-digital conversion capacitor network 1 comprise: a reset signal $V_{rst}$ and a light intensity signal $V_{sig}$ inputted from the image sensor, and a first reference voltage $V_{rn}$ and a first reference voltage $V_{rp}$ from an external reference voltage source. The extended count-type integration cycle-successive approximation hybrid analog-to-digital conversion capacitor network 1 preprocesses the acquired signals, including at least removing noises of the acquired signals and integrating an effective light intensity signal ($V_{RST}$–$V_{SIG}$). The operational amplifier 2 has a positive input terminal ($V_{ip}$) and a negative input terminal ($V_{in}$) connected to an output terminal of the extended count-type integration cycle-successive approximation hybrid analog-to-digital conversion capacitor network 1 and configured to utilize "virtual short" of the two input terminals of the operational amplifier and the charge conservation principle, to achieve extended count-type integration cycle-successive approximation hybrid analog-to-digital conversion. The voltage comparator 3 has a positive input terminal ($V_{ip,cmp}$) connected to a positive output terminal of the operational amplifier 2, a negative input terminal ($V_{in,cmp}$) connected to a negative output terminal of the operational amplifier 2, and an output terminal connected to the extended count-type integration cycle-successive approximation hybrid analog-to-digital conversion capacitor network 1, and configured to achieve a voltage comparison function, and control a switch within the extended count-type integration cycle-successive approximation hybrid analog-to-digital conversion capacitor network (1). The control signal generator 4 is configured to provide a control signal to the extended count-type integration cycle-successive approximation hybrid analog-to-digital conversion capacitor network 1. The accumulator 5 is configured to accumulate an output of the voltage comparator 3 during an extended count-type integration process. The first latch 6 is configured to temporarily store an output of a first cycle-successive approximation hybrid analog-to-digital conversion. The second latch 7 is configured to temporarily store an output of a second cycle-successive approximation hybrid analog-to-digital conversion. The digital processor 8 is configured to synthesize digital signals output from the accumulator 5, the first latch 6 and the second latch 7 to obtain a final digital signal corresponding to an effective light intensity signal output from the image sensor.

Hereinafter, the analog readout preprocessing circuit for a CMOS image sensor and the various components thereof according to the embodiment of the present disclosure will be described in detail.

Figure 3:
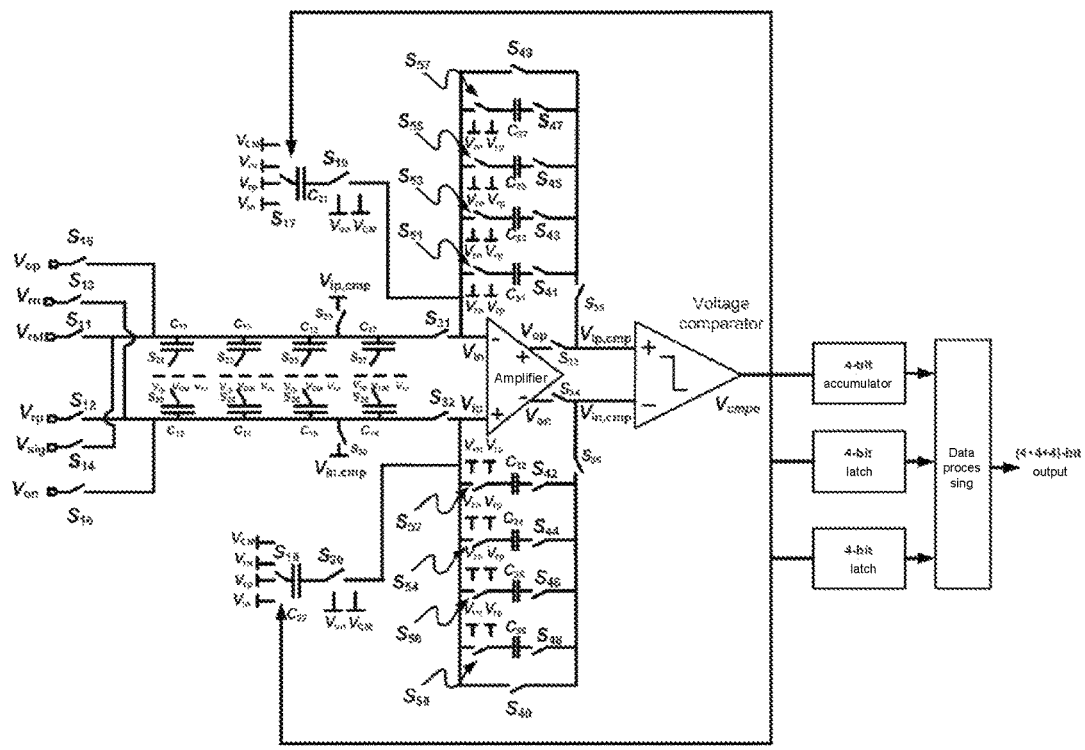
FIG. 3 is a detailed circuit diagram of the analog readout preprocessing circuit shown in FIG. 2.

FIG. 3 is a detailed circuit diagram of the analog readout preprocessing circuit shown in FIG. 2. As shown in FIG. 3, the analog readout preprocessing circuit comprises an operational amplifier 2, a voltage comparator 3, capacitors $C_{11}$, $C_{13}$, $C_{15}$, $C_{17}$, $C_{12}$, $C_{14}$, $C_{16}$, $C_{18}$, $C_{21}$, $C_{22}$, $C_{31}$, $C_{33}$, $C_{35}$, $C_{37}$, $C_{32}$, $C_{34}$, $C_{36}$ and $C_{38}$; and switches $S_{11}$, $S_{13}$, $S_{15}$, $S_{17}$, $S_{12}$, $S_{14}$, $S_{16}$, $S_{18}$, $S_{19}$, $S_{20}$, $S_{21}$, $S_{23}$, $S_{25}$, $S_{27}$, $S_{22}$, $S_{24}$, $S_{26}$, $S_{28}$, $S_{41}$, $S_{43}$, $S_{45}$, $S_{47}$, $S_{42}$, $S_{44}$, $S_{46}$, $S_{48}$, $S_{51}$, $S_{53}$, $S_{55}$, $S_{57}$, $S_{52}$, $S_{54}$, $S_{56}$ and $S_{58}$.

The extended count-type integration cycle-successive approximation hybrid analog-to-digital conversion capacitor network 1 is configured to achieve extended count-type integration and analog-to-digital conversion of the signals. Referring to FIG. 3, the extended count-type integration cycle-successive approximation hybrid analog-to-digital conversion capacitor network 1 comprises an eleventh capacitor through an eighteenth capacitor ($C_{11}$, $C_{12}$, $C_{13}$, $C_{14}$, $C_{15}$, $C_{16}$, $C_{17}$ and $C_{18}$), a twenty-first capacitor through a twenty-second capacitor ($C_{21}$ and $C_{22}$), a thirty-first capacitor through a thirty-eighth capacitor ($C_{31}$, $C_{32}$, $C_{33}$, $C_{34}$, $C_{35}$, $C_{36}$, $C_{37}$ and $C_{38}$), an eleventh switch through a twenty-eighth switch ($S_{11}$, $S_{12}$, $S_{13}$, $S_{14}$, $S_{15}$, $S_{16}$, $S_{17}$, $S_{18}$, $S_{19}$, $S_{20}$, $S_{21}$, $S_{22}$, $S_{23}$, $S_{24}$, $S_{25}$, $S_{26}$, $S_{27}$ and $S_{28}$), a forty-first switch through a forty-eighth switch ($S_{41}$, $S_{42}$, $S_{43}$, $S_{44}$, $S_{45}$, $S_{46}$, $S_{47}$ and $S_{48}$), and a fifty-first switch through a fifty-eighth switch ($S_{51}$, $S_{52}$, $S_{53}$, $S_{54}$, $S_{55}$, $S_{56}$, $S_{57}$ and $S_{58}$).

The eleventh switch ($S_{11}$) has a first terminal connected to an output terminal of the image sensor to receive a reset signal $V_{rst}$ inputted from the image sensor, and a second terminal connected to lower plates of the eleventh, thirteenth, fifteenth and seventeenth capacitors ($C_{11}$, $C_{13}$, $C_{15}$ and $C_{17}$), The thirteenth switch ($S_{13}$) has a first terminal connected to a negative reference voltage ($V_{rn}$), and a second terminal connected to lower plates of the twelfth, fourteenth, sixteenth and eighteenth capacitors ($C_{12}$, $C_{14}$, $C_{16}$ and $C_{18}$).

The fifteenth switch ($S_{15}$) has a first terminal connected to the positive output terminal ($V_{op}$) of the operational amplifier, and a second terminal connected to the lower plates of the eleventh, thirteenth, fifteenth and seventeenth capacitors ($C_{11}$, $C_{13}$, $C_{15}$ and $C_{17}$).

The twelfth switch ($S_{12}$) has a first terminal connected to a positive reference voltage ($V_{rp}$), and a second terminal connected to the lower plates of the twelfth, fourteenth, sixteenth and eighteenth capacitors ($C_{12}$, $C_{14}$, $C_{16}$ and $C_{18}$).

The fourteenth switch ($S_{14}$) has a first terminal connected to the output terminal of the image sensor, and a second terminal connected to the lower plates of the eleventh, thirteenth, fifteenth and seventeenth capacitors ($C_{11}$, $C_{13}$, $C_{15}$ and $C_{17}$).

The sixteenth switch ($S_{16}$) has a first terminal connected to the negative output terminal ($V_{on}$) of the operational amplifier, and a second terminal connected to the lower plates of the twelfth, fourteenth, sixteenth and eighteenth capacitors ($C_{12}$, $C_{14}$, $C_{16}$ and $C_{18}$).

The seventeenth switch ($S_{17}$) has a first terminal connected to a common-mode voltage ($V_{CM}$), the positive reference voltage ($V_{rp}$), the negative reference voltage ($V_{rn}$), and the negative input terminal ($V_{in}$) of the operational amplifier, and a second terminal connected to a lower plate of the twenty-first capacitor ($C_{21}$).

The eighteenth switch ($S_{18}$) has a first terminal connected to the common-mode voltage ($V_{CM}$), the positive reference voltage ($V_{rp}$), the negative reference voltage ($V_{rn}$), and the negative input terminal ($V_{in}$) of the operational amplifier, and a second terminal connected to a lower plate of the twenty-second capacitor ($C_{22}$).

The nineteenth switch ($S_{19}$) has a first terminal connected to an upper plate of the twenty-first capacitor ($C_{21}$), and a second terminal connected to the common-mode voltage ($V_{CM}$), the positive output terminal ($V_{op}$) of the operational amplifier, and the negative input terminal ($V_{in}$) of the operational amplifier.

The twentieth switch ($S_{20}$) has a first terminal connected to an upper plate of the twenty-second capacitor ($C_{22}$), and a second terminal connected to the common-mode voltage ($V_{CM}$), the negative output terminal ($V_{on}$) of the operational amplifier, and the positive input terminal ($V_{ip}$) of the operational amplifier.

The twenty-first switch ($S_{21}$) has a first terminal connected to an upper plate of the eleventh capacitor ($C_{11}$), and a second terminal connected to the common-mode voltage ($V_{CM}$), the positive reference voltage ($V_{rp}$), and the negative reference voltage ($V_{rn}$).

The twenty-third switch ($S_{23}$) has a first terminal connected to an upper plate of the thirteenth capacitor ($C_{13}$), and a second terminal connected to the common-mode voltage ($V_{CM}$), the positive reference voltage ($V_{rp}$), and the negative reference voltage ($V_{rn}$).

The twenty-fifth switch ($S_{25}$) has a first terminal connected to an upper plate of the fifteenth capacitor ($C_{15}$), and a second terminal connected to the common-mode voltage ($V_{CM}$), the positive reference voltage ($V_{rp}$), and the negative reference voltage ($V_{rn}$).

The twenty-seventh switch ($S_{27}$) has a first terminal connected to an upper plate of the seventeenth capacitor ($C_{17}$), and a second terminal connected to the common-mode voltage ($V_{CM}$), the positive reference voltage ($V_{rp}$), and the negative reference voltage ($V_{rn}$).

The twenty-second switch ($S_{22}$) has a first terminal connected to an upper plate of the twelfth capacitor ($C_{12}$), and a second terminal connected to the common-mode voltage ($V_{CM}$), the positive reference voltage ($V_{rp}$), and the negative reference voltage ($V_{rn}$).

The twenty-fourth switch ($S_{24}$) has a first terminal connected to an upper plate of the fourteenth capacitor ($C_{14}$), and a second terminal connected to the common-mode voltage ($V_{CM}$), the positive reference voltage ($V_{rp}$), and the negative reference voltage ($V_{rn}$).

The twenty-sixth switch ($S_{26}$) has a first terminal connected to an upper plate of the sixteenth capacitor ($C_{16}$), and a second terminal connected to the common-mode voltage ($V_{CM}$), the positive reference voltage ($V_{rp}$), and the negative reference voltage ($V_{rn}$).

The twenty-eighth switch ($S_{28}$) has a first terminal connected to an upper plate of the eighteenth capacitor ($C_{18}$), and a second terminal connected to the common-mode voltage ($V_{CM}$), the positive reference voltage ($V_{rp}$), and the negative reference voltage ($V_{rn}$).

The twenty-ninth switch ($S_{29}$) has a first terminal connected to the positive input terminal ($V_{ip,comp}$) of the voltage comparator, and a second terminal connected to the lower plates of the eleventh, thirteenth, fifteenth and seventeenth capacitors ($C_{11}$, $C_{13}$, $C_{15}$ and $C_{17}$).

The thirtieth switch ($S_{30}$) has a first terminal connected to the negative input terminal ($V_{in,comp}$) of the voltage comparator, and a second terminal connected to the lower plates of the twelfth, fourteenth, sixteenth and eighteenth capacitors ($C_{12}$, $C_{14}$, $C_{16}$ and $C_{18}$), The thirty-first switch ($S_{31}$) has a first terminal connected to the lower plates of the eleventh, thirteenth, fifteenth and seventeenth capacitors ($C_{11}$, $C_{13}$, $C_{15}$ and $C_{17}$), and a second terminal connected to the negative input terminal ($V_{in}$) of the operational amplifier.

The thirty-second switch ($S_{32}$) has a first terminal connected to the lower plates of the twelfth, fourteenth, sixteenth and eighteenth capacitors ($C_{12}$, $C_{14}$, $C_{16}$ and $C_{18}$), and a second terminal connected to the positive input terminal ($V_{ip}$) of the operational amplifier.

The thirty-third switch ($S_{33}$) has a first terminal connected to the positive output terminal ($V_{op}$) of the operational amplifier, and a second terminal connected to the positive input terminal ($V_{ip,comp}$) of the voltage comparator.

The thirty-fourth switch ($S_{34}$) has a first terminal connected to the negative output terminal ($V_{on}$) of the operational amplifier, and a second terminal connected to the negative input terminal ($V_{in,comp}$) of the voltage comparator.

The thirty-fifth switch ($S_{35}$) has a first terminal connected to second terminals of the forty-first, forty-third, forty-fifth, forty-seventh and forty-ninth switches ($S_{41}$, $S_{43}$, $S_{45}$, $S_{47}$ and $S_{49}$), and a second terminal connected to the positive input terminal ($V_{ip,comp}$) of the comparator.

The thirty-sixth switch ($S_{36}$), has a first terminal connected to second terminals of the forty-second, forty-fourth, forty-sixth, forty-eighth and fortieth switches ($S_{42}$, $S_{44}$, $S_{46}$, $S_{48}$ and $S_{40}$), and a second terminal connected to the negative input terminal ($V_{in,comp}$) of the comparator.

The forty-first switch ($S_{41}$) has a first terminal connected to a lower plate of the thirty-first capacitor ($C_{31}$) and a second terminal connected to the first terminal of the thirty-fifth switch ($S_{35}$).

The forty-third switch ($S_{43}$) has a first terminal connected to a lower plate of the thirty-third capacitor ($C_{33}$) and a second terminal connected to the first terminal of the thirty-fifth switch ($S_{35}$).

The forty-fifth switch ($S_{45}$) has a first terminal connected to a lower plate of the thirty-fifth capacitor ($C_{35}$) and a second terminal connected to the first terminal of the thirty-fifth switch ($S_{35}$).

The forty-seventh switch ($S_{47}$) has a first terminal connected to a lower plate of the thirty-seventh capacitor ($C_{37}$) and a second terminal connected to the first terminal of the thirty-fifth switch ($S_{35}$).

The forty-ninth switch ($S_{49}$) has a first terminal connected to the negative input terminal ($V_{in}$) of the operational amplifier and a second terminal connected to the first terminal of the thirty-fifth switch ($S_{35}$).

The forty-second switch ($S_{42}$) has a first terminal connected to a lower plate of the thirty-second capacitor ($C_{32}$) and a second terminal connected to the first terminal of the thirty-sixth switch ($S_{36}$).

The forty-fourth switch ($S_{44}$) has a first terminal connected to a lower plate of the thirty-fourth capacitor ($C_{34}$) and a second terminal connected to the first terminal of the thirty-sixth switch ($S_{36}$).

The forty-sixth switch ($S_{42}$) has a first terminal connected to a lower plate of the thirty-sixth capacitor ($C_{36}$) and a second terminal connected to the first terminal of the thirty-sixth switch ($S_{36}$).

The forty-eighth switch ($S_{48}$) has a first terminal connected to a lower plate of the thirty-eighth capacitor ($C_{38}$) and a second terminal connected to the first terminal of the thirty-sixth switch ($S_{36}$).

The fortieth switch ($S_{48}$) has a first terminal connected to the positive input terminal ($V_{ip}$) of the operational amplifier and a second terminal connected to the first terminal of the thirty-sixth switch ($S_{36}$).

The fifty-first switch ($S_{51}$) has a first terminal connected to the negative input terminal ($V_{in}$) of the operational amplifier, the negative reference voltage ($V_{rn}$), and the positive reference voltage ($V_{rp}$), and a second terminal connected to an upper plate of the thirty-first capacitor ($C_{31}$).

The fifty-third switch ($S_{53}$) has a first terminal connected to the negative input terminal ($V_{in}$) of the operational amplifier, the negative reference voltage ($V_{rn}$), and the positive reference voltage ($V_{rp}$), and a second terminal connected to an upper plate of the thirty-third capacitor ($C_{33}$).

The fifty-fifth switch ($S_{55}$) has a first terminal connected to the negative input terminal ($V_{in}$) of the operational amplifier, the negative reference voltage ($V_{rn}$), and the positive reference voltage ($V_{rp}$), and a second terminal connected to an upper plate of the thirty-fifth capacitor ($C_{35}$).

The fifty-seventh switch ($S_{57}$) has a first terminal connected to the negative input terminal ($V_{in}$) of the operational amplifier, the negative reference voltage ($V_{rn}$), and the positive reference voltage ($V_{rp}$), and a second terminal connected to an upper plate of the thirty-seventh capacitor ($C_{37}$).

The fifty-second switch ($S_{52}$) has a first terminal connected to the positive input terminal ($V_{ip}$) of the operational amplifier, the negative reference voltage ($V_{rn}$), and the positive reference voltage ($V_{rp}$), and a second terminal connected to an upper plate of the thirty-second capacitor ($C_{32}$).

The fifty-fourth switch ($S_{54}$) has a first terminal connected to the positive input terminal ($V_{ip}$) of the operational amplifier, the negative reference voltage ($V_{rn}$), and the positive reference voltage ($V_{rp}$), and a second terminal connected to an upper plate of the thirty-fourth capacitor ($C_{34}$).

The fifty-sixth switch ($S_{56}$) has a first terminal connected to the positive input terminal ($V_{ip}$) of the operational amplifier, the negative reference voltage ($V_{rn}$), and the positive reference voltage ($V_{rp}$), and a second terminal connected to an upper plate of the thirty-sixth capacitor ($C_{36}$).

The fifty-eighth switch ($S_{58}$) has a first terminal connected to the positive input terminal ($V_{ip}$) of the operational amplifier, the negative reference voltage ($V_{rn}$), and the positive reference voltage ($V_{rp}$), and a second terminal connected to an upper plate of the thirty-eighth capacitor ($C_{38}$).

The eleventh capacitor through the eighteenth capacitor ($C_{11}$, $C_{12}$, $C_{13}$, $C_{14}$, $C_{15}$, $C_{16}$, $C_{17}$ and $C_{18}$), the twenty-first capacitor through the twenty-second capacitor ($C_{21}$ and $C_{22}$), the thirty-first capacitor through the thirty-eighth capacitor ($C_{31}$, $C_{32}$, $C_{33}$, $C_{34}$, $C_{35}$, $C_{36}$, $C_{37}$ and $C_{38}$), the eleventh switch through the fourteenth switch ($S_{11}$, $S_{12}$, $S_{13}$ and $S_{14}$), the seventeenth switch through the twenty-eighth switch ($S_{17}$, $S_{18}$, $S_{19}$, $S_{20}$, $S_{21}$, $S_{22}$, $S_{23}$, $S_{24}$, $S_{25}$, $S_{26}$, $S_{27}$ and $S_{28}$), the thirty-first switch through the thirty-sixth switch ($S_{31}$, $S_{32}$, $S_{33}$, $S_{34}$, $S_{35}$ and $S_{36}$), the forty-first switch through the fifty-eighth switch ($S_{41}$, $S_{42}$, $S_{43}$, $S_{44}$, $S_{45}$, $S_{46}$, $S_{47}$, $S_{49}$, $S_{51}$, $S_{50}$, $S_{51}$, $S_{52}$, $S_{53}$, $S_{54}$, $S_{55}$, $S_{56}$, $S_{57}$ and $S_{58}$) in the extended count-type integration cycle-successive approximation hybrid analog-to-digital conversion capacitor network 1 constitutes an extended count-type integrator along with the operational amplifier 2 and the voltage comparator 3.

The extended count-type integration cycle-successive approximation hybrid analog-to-digital conversion capacitor network 1 achieves functions of the extended count-type integration and cycle-successive approximation hybrid analog-to-digital conversion along with the operational amplifier 2 and the voltage comparator 3.

Figure 4:
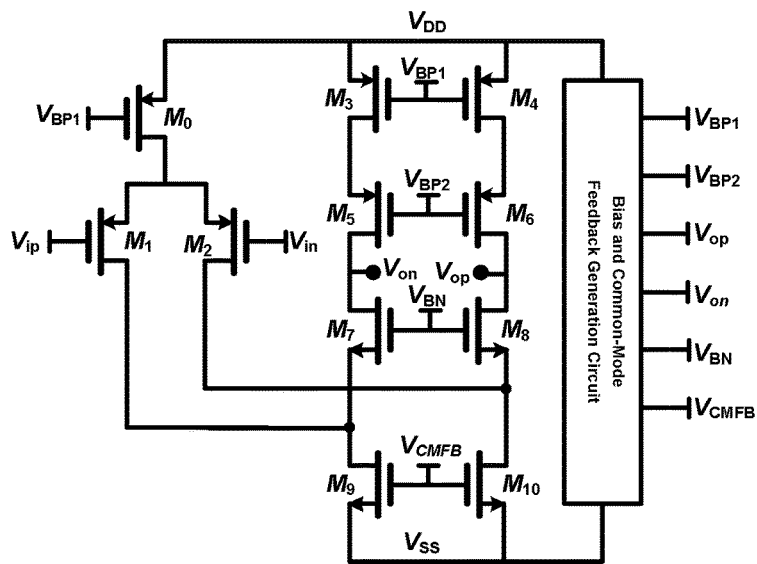
FIG. 4 is a schematic structural diagram of an operational amplifier in the analog readout preprocessing circuit shown in FIG. 2.

The operational amplifier 2 is configured to utilize "virtual short" of the two input terminals of the operational amplifier and the charge conservation principle in the extended count-type integration cycle-successive approximation hybrid analog-to-digital conversion capacitor network 1, to achieve extended count-type integration cycle-successive approximation hybrid analog-to-digital conversion. FIG. 4 is a schematic structural diagram of the operational amplifier in the analog readout preprocessing circuit shown in FIG. 2. Referring to FIG. 4, the operational amplifier comprises a zeroth transistor through a tenth transistor ($M_0$~$M_{10}$) and a bias and common-mode feedback generation circuit.

The bias and common-mode feedback generation circuit is configured to generate bias voltages ($V_{BP1}$, $V_{BP2}$ and $V_{BN}$) and a common-mode feedback voltage ($V_{CMFB}$).

The zeroth transistor ($M_0$) has a gate connected to the bias voltage ($V_{BP1}$), and a source connected to a power supply ($V_{DD}$).

The first transistor ($M_1$) has a gate connected to the positive input terminal ($V_{ip}$) of the operational amplifier, a source connected to a drain of the zeroth transistor ($M_0$), and a drain connected to a source of the seventh transistor ($M_7$) and a drain of the ninth transistor ($M_9$).

The second transistor ($M_2$) has a gate connected to the negative input terminal ($V_{in}$) of the operational amplifier, a source connected to the drain of the zeroth transistor ($M_0$), and a drain connected to a source of the eighth transistor ($M_8$) and a drain of the tenth transistor ($M_{10}$).

The third transistor ($M_3$) has a gate connected to the bias voltage ($V_{BP1}$), a source connected to the power supply ($V_{DD}$), and a drain connected to a source of the fifth transistor ($M_5$).

The fourth transistor ($M_4$) has a gate connected to the bias voltage ($V_{BP1}$), a source connected to the power supply ($V_{DD}$), and a drain connected to a source of the sixth transistor ($M_6$).

The fifth transistor ($M_5$) has a gate connected to the bias voltage ($V_{BP2}$), and a drain connected to a drain of the seventh transistor ($M_7$) and the negative output terminal ($V_{on}$) of the operational amplifier.

The sixth transistor ($M_6$) has a gate connected to the bias voltage ($V_{BP2}$), and a drain connected to a drain of the eighth transistor ($M_8$) and the positive output terminal ($V_{op}$) of the operational amplifier.

The seventh transistor ($M_7$) has a gate connected to the bias voltage ($V_{BN}$).

The eighth transistor ($M_8$) has a gate connected to the bias voltage ($V_{BN}$).

The ninth transistor ($M_9$) has a gate connected to the common-mode feedback voltage ($V_{CMFB}$), and a source connected to the ground (Vss).

The tenth transistor ($M_{10}$) has a gate connected to the common-mode feedback voltage ($V_{CMFB}$), and a source connected to the ground (Vss).

Figure 5:
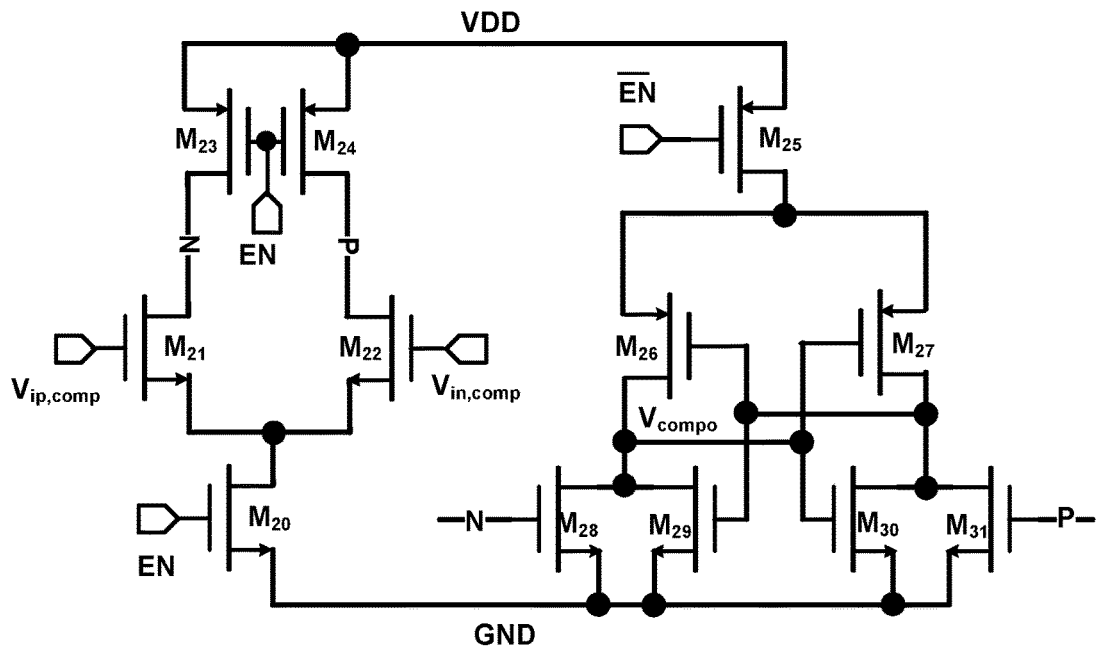
FIG. 5 is a schematic structural diagram of a comparator in the analog readout preprocessing circuit shown in FIG. 2.

The voltage comparator 3 is configured to compare signals at its positive input terminal and negative input terminal. FIG. 5 is a schematic structural diagram of the voltage comparator in the analog readout preprocessing circuit shown in FIG. 2. Referring to FIG. 5, the voltage comparator comprises a twentieth transistor through a thirty-first transistor ($M_{20}$~$M_{31}$).

The twentieth transistor ($M_{20}$) has a gate connected to an enabling signal (EN), and a source connected to the ground (GND).

The twenty-first transistor ($M_{21}$) has a gate connected to the positive input terminal ($V_{ip,cmp}$) of the voltage comparator, a source connected to a drain of the twentieth transistor ($M_{20}$), and a drain connected to a drain of the twenty-third transistor ($M_{23}$) and a gate of the twenty-eighth transistor ($M_{28}$).

The twenty-second transistor ($M_{22}$) has a gate connected to the negative input terminal ($V_{in,cmp}$) of the voltage comparator, a source connected to the drain of the twentieth transistor ($M_{20}$), and a drain connected to a drain of the twenty-fourth transistor ($M_{24}$) and a gate of the thirty-first transistor ($M_{31}$).

The twenty-third transistor ($M_{23}$) has a gate connected to the enabling signal (EN), a source connected to the power supply ($V_{DD}$), and a drain connected to the drain of the twenty-first transistor ($M_{21}$) and the gate of the twenty-eighth transistor ($M_{28}$).

The twenty-fourth transistor ($M_{24}$) has a gate connected to the enabling signal (EN), a source connected to the power supply ($V_{DD}$), and a drain connected to the drain of the twenty-second transistor ($M_{22}$) and the gate of the thirty-first transistor ($M_{31}$).

The twenty-fifth transistor ($M_{25}$) has a gate connected to an inverted signal ($\overline{\text{EN}}$) of the enabling signal (EN), a source connected to the power supply $V_{DD}$, and a drain connected to sources of the twenty-sixth transistor and the twenty-seventh transistor ($M_{26}$ and $M_{27}$).

The twenty-sixth transistor ($M_{26}$) has a gate connected to a drain of the twenty-seventh transistor ($M_{27}$) and a gate of the twenty-ninth transistor ($M_{29}$), and a drain connected to gates of the twenty-seventh and thirtieth transistors ($M_{27}$ and $M_{30}$), drains of the twenty-eighth and twenty-ninth transistors ($M_{28}$ and $M_{29}$) and the output terminal ($V_{cmpo}$) of the voltage comparator.

The twenty-seventh transistor ($M_{27}$) has a gate connected to the drain of the twenty-sixth transistor ($M_{26}$) and the gate of the thirtieth transistor ($M_{30}$), and a drain connected to the gates of the twenty-sixth and twenty-ninth transistors ($M_{26}$ and $M_{29}$) and drains of the thirtieth and thirty-first transistors ($M_{30}$ and $M_{31}$).

The twenty-eighth transistor ($M_{28}$) has a source connected the ground (GND).

The twenty-ninth transistor ($M_{29}$) has a source connected the ground (GND).

The thirtieth transistor ($M_{30}$) has a source connected the ground (GND).

The thirty-first transistor ($M_{31}$) has a source connected the ground (GND).

The control signal generator 4 is configured to provide a control signal to the extended count-type integration cycle-successive approximation hybrid analog-to-digital conversion capacitor network 1. The control signals provided from the control signal generator 4 comprises control signals for the eleventh switch through the twenty-eighth switch ($S_{11}$, $S_{12}$, $S_{13}$, $S_{14}$, $S_{15}$, $S_{16}$, $S_{17}$, $S_{18}$, $S_{19}$, $S_{20}$, $S_{21}$, $S_{22}$, $S_{23}$, $S_{24}$, $S_{25}$, $S_{26}$, $S_{27}$ and $S_{28}$), the forty-first through the forty-eighth switch ($S_{41}$, $S_{42}$, $S_{43}$, $S_{44}$, $S_{45}$, $S_{46}$, $S_{47}$ and $S_{48}$) and the fifty-first switch through the fifty-eighth switch ($S_{51}$, $S_{52}$, $S_{53}$, $S_{54}$, $S_{55}$, $S_{56}$, $S_{57}$ and $S_{58}$), and control signals for the accumulator, the first latch and the second latch.

According to the analog readout preprocessing circuit for a CMOS image sensor as shown in FIGS. 1 to 5, the present disclosure also provides a control method for the analog readout preprocessing circuit, which is executed by the control signal generator 4 and specifically comprises the following steps.

At step A, the extended count-type integrator samples a reset signal output from the image sensor.

The step where the extended count-type integrator samples a reset signal output from the image sensor further comprises: causing the second terminals of the eleventh switch ($S_{11}$), the twelfth switch ($S_{12}$) the twenty-first, twenty-third, twenty-fifth and twenty-seventh switches ($S_{21}$, $S_{23}$, $S_{25}$ and $S_{27}$) to connect to the common-mode voltage ($V_{CM}$), the second terminals of the twenty-second, twenty-fourth, twenty-sixth and twenty-eighth switches ($S_{22}$, $S_{24}$, $S_{26}$ and $S_{28}$) to connect to the common-mode voltage ($V_{CM}$); causing the thirteenth switch ($S_{13}$), the fifteenth switch ($S_{15}$), the fourteenth switch ($S_{14}$) and the sixteenth switch ($S_{16}$) to turn off; causing the twenty-ninth, thirtieth, thirty-first and thirty-second switches ($S_{29}$, $S_{30}$, $S_{31}$ and $S_{32}$) to turn off; causing the first terminals of the seventeenth, eighteenth, nineteenth and twentieth switches ($S_{17}$, $S_{18}$, $S_{19}$ and $S_{20}$) to connect to the common-mode voltage ($V_{CM}$); causing the thirty-third, thirty-fourth, thirty-fifth and thirty-sixth switches ($S_{33}$, $S_{34}$, $S_{35}$ and $S_{36}$), the forty-first, forty-third, forty-fifth, forty-seventh and forty-ninth switches ($S_{41}$, $S_{43}$, $S_{45}$, $S_{47}$ and $S_{49}$) and the forty-second, forty-fourth, forty-sixth, forty-eighth and fortieth switches ($S_{42}$, $S_{44}$, $S_{46}$, $S_{48}$ and $S_{40}$) to turn on; causing the first terminals of the fifty-first, fifty-third, fifty-fifth and fifty-seventh switches ($S_{51}$, $S_{53}$, $S_{55}$ and $S_{57}$) to connect to the negative input terminal ($V_{in}$) of the operational amplifier; causing the fifty-second, fifty-fourth, fifty-sixth and fifty-eighth switches ($S_{52}$, $S_{54}$, $S_{56}$ and $S_{58}$) to connect to the positive input terminal ($V_{ip}$) of the operational amplifier; and causing the accumulator 5 to clear.

At step B, the extended count-type integrator integrates the reset signal output from the image sensor for the first time after the sampling operation, and transfers the sampled signal to an integrating capacitor to reduce noise power of the reset signal. The integrating capacitor comprises an upper integrating capacitor and a lower integrating capacitor; wherein the upper integrating capacitor comprises a thirty-first capacitor ($C_{31}$), a thirty-third capacitor ($C_{33}$), a thirty-fifth capacitor ($C_{35}$) and a thirty-seventh capacitor ($C_{37}$), and the lower integrating capacitor comprises a thirty-second capacitor ($C_{32}$), a thirty-fourth capacitor ($C_{34}$), a thirty-sixth capacitor ($C_{36}$) and a thirty-eighth capacitor ($C_{38}$).

The step where the extended count-type integrator integrates the reset signal output from the image sensor for the first time further comprises: causing the eleventh and twelfth switches ($S_{11}$ and $S_{12}$) to turn off; causing the forty-ninth and fortieth switches ($S_{49}$ and $S_{40}$) to turn off; causing the thirty-first and thirty-second switches ($S_{31}$ and $S_{32}$) to turn on; causing the second terminal of the nineteenth switch ($S_{19}$) to connect to the negative input terminal ($V_{in}$) of the operational amplifier; comparing, by the voltage comparator, the voltage ($V_{ip,cmp}$) at the positive input terminal and the voltage ($V_{in,cmp}$) at the negative input terminal, and outputting, at the output terminal ($V_{cmpo}$) of the voltage comparator, a logic high level if the voltage ($V_{ip,cmp}$) at the positive input terminal is higher than the voltage ($V_{in,cmp}$) at the negative input terminal, and a logic low level if the voltage ($V_{ip,cmp}$) at the positive input terminal is lower than the voltage ($V_{in,cmp}$) at the negative input terminal; causing the first terminal of the seventeenth switch ($S_{17}$) to connect to the positive reference voltage ($V_{rp}$) if a logic high level is output at the output terminal ($V_{cmpo}$) of the voltage comparator, and causing the first terminal of the seventeenth switch ($S_{17}$) to connect to the positive reference voltage ($V_{rp}$) if a logic low level is output at the output terminal ($V_{cmpo}$) of the voltage comparator; causing the first terminal of the eighteenth switch ($S_{18}$) to connect to the negative reference voltage ($V_{rn}$) if a logic high level is output at the output terminal ($V_{cmpo}$) of the voltage comparator, and causing the first terminal of the eighteenth switch ($S_{18}$) to connect to the negative reference voltage ($V_{rn}$) if a logic low level is output at the output terminal ($V_{cmpo}$) of the voltage comparator; causing the second terminals of the twenty-first through twenty-eighth switches ($S_{21}$ through $S_{28}$) to connect to the common-mode voltage ($V_{CM}$); and accumulating, by the accumulator, the output of the voltage comparator with its original value.

At step C, the reset signal output from the image sensor is integrated fifteen times after the integration for the first time. That is, step A and step B are sequentially performed for fifteen times, where the forty-ninth and fortieth switches are turned off each time step A is performed.

At step D, an effective light intensity signal output from the image sensor is integrated another sixteen times after the reset signal output from the image sensor has been integrated sixteen times. That is, steps A, B and C are sequentially performed for sixteen times in which the reset signal is replaced with the effective light intensity signal, where the thirteenth and fourteenth switches are turned on, the eleventh and twelfth switches are turned off and the forty-ninth and fortieth switches are turned off each time step A is performed.

At step E, first cycle-successive approximation hybrid analog-to-digital conversion is performed on a difference ($V_{op}$–$V_{on}$) of $V_{op}$ and $V_{on}$ at the output terminals of the amplifier after the integrations of the reset signal and the effective light intensity signal have completed.

The first cycle-successive approximation hybrid analog-to-digital conversion is performed by the following elements: the eleventh capacitor through the eighteenth capacitor ($C_{11}$, $C_{12}$, $C_{13}$, $C_{14}$, $C_{15}$, $C_{16}$, $C_{17}$ and $C_{18}$), the twenty-first capacitor through the twenty-second capacitor ($C_{21}$ and $C_{22}$), the thirty-first capacitor through the thirty-eighth capacitor ($C_{31}$, $C_{32}$, $C_{33}$, $C_{34}$, $C_{35}$, $C_{36}$, $C_{37}$ and $C_{38}$), the fifteenth and sixteenth switches ($S_{15}$, $S_{16}$), the seventeenth switch through the twenty-eighth switch ($S_{17}$, $S_{18}$, $S_{19}$, $S_{20}$, $S_{21}$, $S_{22}$, $S_{23}$, $S_{24}$, $S_{25}$, $S_{26}$, $S_{27}$ and $S_{28}$), the thirty-first switch through the thirty-fourth switch ($S_{31}$, $S_{32}$, $S_{33}$ and $S_{34}$), the forty-first through the fifty-eighth switch ($S_{41}$, $S_{42}$, $S_{43}$, $S_{44}$, $S_{45}$, $S_{46}$, $S_{47}$, $S_{49}$, $S_{51}$, $S_{50}$, $S_{51}$, $S_{52}$, $S_{53}$, $S_{54}$, $S_{55}$, $S_{56}$, $S_{57}$ and $S_{58}$); the operational amplifier (2) and the voltage comparator (3), wherein a resolution of the analog-to-digital conversion is 4 bits.

The first cycle-successive approximation hybrid analog-to-digital conversion further comprises: causing the thirty-third and thirty-fourth switches to turn off; comparing, by the voltage comparator, the voltage ($V_{ip,cmp}$) at the positive input terminal and the voltage ($V_{in,cmp}$) at the negative input terminal, and outputting, at the output terminal ($V_{cmpo}$) of the voltage comparator, a logic high level if the voltage ($V_{ip,cmp}$) at the positive input terminal is higher than the voltage ($V_{in,cmp}$) at the negative input terminal, and a logic low level if the voltage ($V_{ip,cmp}$) at the positive input terminal is lower than the voltage ($V_{in,cmp}$) at the negative input terminal; causing the first terminal of the fifty-first switch ($S_{51}$) to connect to the negative reference voltage ($V_{rn}$) and the first terminal of the fifty-second switch ($S_{52}$) to connect to the positive reference voltage ($V_{rp}$) if a logic high level is output at the output terminal ($V_{cmpo}$) of the voltage comparator, and causing the first terminal of the fifty-first switch ($S_{51}$) to connect to the positive reference voltage ($V_{rp}$) and the first terminal of the fifty-second switch ($S_{52}$) to connect to the negative reference voltage ($V_{rn}$) if a logic low level is output at the output terminal ($V_{cmpo}$) of the voltage comparator; comparing, by the voltage comparator, the voltage ($V_{ip,cmp}$) at the positive input terminal and the voltage ($V_{in,cmp}$) at the negative input terminal continuously; causing the first terminal of the fifty-third switch ($S_{53}$) to connect to the negative reference voltage ($V_{rn}$) and the first terminal of the fifty-fourth switch ($S_{54}$) to connect to the positive reference voltage ($V_{rp}$) if a logic high level is output at the output terminal ($V_{cmpo}$) of the voltage comparator; causing the first terminal of the fifty-third switch ($S_{53}$) to connect to the positive reference voltage ($V_{rp}$) and the first terminal of the fifty-fourth switch ($S_{54}$) to connect to the negative reference voltage ($V_{rn}$) if a logic low level is output at the output terminal ($V_{cmpo}$) of the voltage comparator; further executing the foregoing steps twice until connections of the first terminals of the fifty-fifth, fifty-seventh, fifty-sixth and the fifty-eighth switches ($S_{55}$, $S_{57}$, $S_{56}$ and $S_{58}$) have been determined; and storing comparison results from the four comparisons of the voltage comparator in a latch.

At step F, a first cycle operation is performed after the first cycle-successive approximation hybrid analog-to-digital conversion. The first cycle operation further comprises: causing the thirty-first and thirty-second switches ($S_{31}$ and $S_{32}$) to turn off; causing the forty-ninth and fortieth switches ($S_{49}$ and $S_{40}$) to turn on; causing the first terminal of the seventeenth switch ($S_{17}$) to connect to the negative input terminal ($V_{in}$) of the operational amplifier; causing the second terminal of the nineteenth switch ($S_{19}$) to connect to the positive output terminal ($V_{op}$) of the operational amplifier; causing the first terminal of the eighteenth switch ($S_{18}$) to connect to the positive input terminal ($V_{ip}$) of the operational amplifier; causing the second terminal of the twentieth switch ($S_{20}$) to connect to the negative output terminal ($V_{on}$) of the operational amplifier; causing the thirty-third and thirty-fourth switches $S_{33}$ and $S_{34}$) to turn on; causing the twenty-ninth and thirtieth switches ($S_{29}$ and $S_{30}$) to connect to the positive input terminal ($V_{ip,pcmp}$) and the negative input terminal ($V_{in,cmp}$) of the voltage comparator, respectively; and causing the fifteenth and sixteenth switches ($S_{15}$ and $S_{16}$) to turn on.

At step G, second cycle-successive approximation hybrid analog-to-digital conversion is performed after the first cycle operation. The second cycle-successive approximation hybrid analog-to-digital conversion further comprises: causing the thirty-third and thirty-fourth switches ($S_{33}$ and $S_{34}$) to turn off; comparing, by the voltage comparator, the voltage ($V_{ip,cmp}$) at the positive input terminal and the voltage ($V_{in,cmp}$) at the negative input terminal, and outputting, at the output terminal ($V_{cmpo}$) of the voltage comparator, a logic high level if the voltage ($V_{ip,cmp}$) at the positive input terminal is higher than the voltage ($V_{in,cmp}$) at the negative input terminal, and a logic low level if the voltage ($V_{ip,cmp}$) at the positive input terminal is lower than the voltage ($V_{in,cmp}$) at the negative input terminal; causing the first terminal of the twenty-first switch ($S_{21}$) to connect to the negative reference voltage ($V_{rn}$) and the first terminal of the twenty-second switch ($S_{22}$) to connect to the positive reference voltage ($V_{rp}$) if a logic high level is output at the output terminal ($V_{cmpo}$) of the voltage comparator, and causing the first terminal of the twenty-first switch ($S_{21}$) to connect to the positive reference voltage ($V_{rp}$) and the first terminal of the twenty-second switch ($S_{22}$) to connect to the negative reference voltage ($V_{rn}$) if a logic low level is output at the output terminal ($V_{cmpo}$) of the voltage comparator; comparing, by the voltage comparator, the voltage ($V_{ip,cmp}$) at the positive input terminal and the voltage ($V_{in,cmp}$) at the negative input terminal continuously; causing the first terminal of the twenty-third switch ($S_{23}$) to connect to the negative reference voltage ($V_{rn}$) and the first terminal of the twenty-fourth switch ($S_{24}$) to connect to the positive reference voltage ($V_{rp}$) if a logic high level is output at the output terminal ($V_{cmpo}$) of the voltage comparator; causing the first terminal of the twenty-third switch ($S_{23}$) to connect to the positive reference voltage ($V_{rn}$) and the first terminal of the twenty-fourth switch ($S_{24}$) to connect to the negative reference voltage ($V_{rn}$) if a logic low level is output at the output terminal ($V_{cmpo}$) of the voltage comparator; further executing the foregoing steps twice until the connections of the first terminals of the twenty-fifth, twenty-seventh, twenty-sixth and the twenty-eighth switches ($S_{25}$, $S_{27}$, $S_{26}$ and $S_{28}$) have been determined; and storing comparison results from the four comparisons of the voltage comparator in a latch.

At step H, the digital processor synthesizes digital signals output from the accumulator, the first latch and the second latch to obtain a final digital signal corresponding to the effective light intensity signal output from the image sensor.

Heretofore, the present embodiment has been described in detail with reference to the drawings. From the above description, those skilled in the art will have a clear understanding of the analog readout preprocessing circuit for a CMOS image sensor and the control method thereof according to the present disclosure.

In addition, the definitions of the elements and methods described above are not limited to the various specific structures, shapes or modes mentioned in the embodiments, and those skilled in the art can make changes or replacements in a simple way.

In view of the above, the analog readout preprocessing circuit for a CMOS image sensor and the control method thereof according to the present disclosure have the advantages of low noise and the advantages of requiring only one operational amplifier, one comparator etc., compared with the traditional preprocessing circuit.

The foregoing detailed description of the objects, technical solutions and advantages of the disclosure has been made in detail, and it is to be understood that the foregoing is only a specific embodiment of the disclosure and is not intended to limit the disclosure. Any modification, equivalent substitution, improvement etc. within the spirit and principles of the disclosure are intended to be included within the protection scope of the present disclosure.

We claim:

1. A an analog readout preprocessing circuit for a solid state complementary metal-oxide-semiconductor (CMOS) image sensor, comprising:
   an extended count-type integration cycle-successive approximation hybrid analog-to-digital conversion capacitor network configured to acquire signals and preprocess the acquired signals to achieve extended count-type integration and analog-to-digital conversion of the signals;
   an operational amplifier with a positive input terminal ($V_{ip}$) and a negative input terminal ($V_{in}$) connected to an output terminal of the extended count-type integration cycle-successive approximation hybrid analog-to-digital conversion capacitor network and configured to utilize "virtual short" of the two input terminals of the operational amplifier and the charge conservation principle, to achieve extended count-type integration cycle-successive approximation hybrid analog-to-digital conversion;
   a voltage comparator with a positive input terminal ($V_{ip, cmp}$) connected to a positive output terminal of the operational amplifier, a negative input terminal ($V_{in, cmp}$) connected to a negative output terminal of the operational amplifier, and an output terminal connected to the extended count-type integration cycle-successive approximation hybrid analog-to-digital conversion capacitor network, and configured to achieve a voltage comparison function, and control a switch within the extended count-type integration cycle-successive approximation hybrid analog-to-digital conversion capacitor network;
   a control signal generator configured to provide a control signal to the extended count-type integration cycle-successive approximation hybrid analog-to-digital conversion capacitor network;
   an accumulator configured to accumulate an output of the voltage comparator during an extended count-type integration process;
   a first latch configured to temporarily store an output of a first cycle-successive approximation hybrid analog-to-digital conversion,
   a second latch configured to temporarily store an output of a second cycle-successive approximation hybrid analog-to-digital conversion; and
   a digital processor configured to synthesize digital signals output from the accumulator, the first latch and the second latch to obtain a final digital signal corresponding to an effective light intensity signal output from the image sensor.

2. The analog readout preprocessing circuit for a solid state CMOS image sensor according to claim 1, wherein the extended count-type integration cycle-successive approximation hybrid analog-to-digital conversion capacitor network comprises an eleventh capacitor through an eighteenth capacitor ($C_{11}$, $C_{12}$, $C_{13}$, $C_{14}$, $C_{15}$, $C_{16}$, $C_{17}$ and $C_{18}$), a twenty-first capacitor through a twenty-second capacitor ($C_{21}$ and $C_{22}$), a thirty-first capacitor through a thirty-eighth capacitor ($C_{31}$, $C_{32}$, $C_{33}$, $C_{34}$, $C_{35}$, $C_{36}$, $C_{37}$ and $C_{38}$), an eleventh switch through a twenty-eighth switch ($S_{11}$, $S_{12}$, $S_{13}$, $S_{14}$, $S_{15}$, $S_{16}$, $S_{17}$, $S_{18}$, $S_{19}$, $S_{20}$, $S_{21}$, $S_{22}$, $S_{23}$, $S_{24}$, $S_{25}$, $S_{26}$, $S_{27}$ and $S_{28}$), a forty-first switch through a forty-eighth switch ($S_{41}$, $S_{42}$, $S_{43}$, $S_{44}$, $S_{45}$, $S_{46}$, $S_{47}$ and $S_{48}$), and a fifty-first switch through a fifty-eighth switch ($S_{51}$, $S_{52}$, $S_{53}$, $S_{54}$, $S_{55}$, $S_{56}$, $S_{57}$ and $S_{58}$); wherein
   the eleventh switch ($S_{11}$) has a first terminal connected to an output terminal of the image sensor to receive a reset signal $V_{rst}$ inputted from the image sensor, and a second terminal connected to lower plates of the eleventh, thirteenth, fifteenth and seventeenth capacitors ($C_{11}$, $C_{13}$, $C_{15}$ and $C_{17}$);
   the thirteenth switch ($S_{13}$) has a first terminal connected to a negative reference voltage ($V_{rn}$), and a second terminal connected to lower plates of the twelfth, fourteenth, sixteenth and eighteenth capacitors ($C_{12}$, $C_{14}$, $C_{16}$ and $C_{18}$);
   the fifteenth switch ($S_{15}$) has a first terminal connected to the positive output terminal ($V_{op}$) of the operational amplifier, and a second terminal connected to the lower plates of the eleventh, thirteenth, fifteenth and seventeenth capacitors ($C_{11}$, $C_{13}$, $C_{15}$ and $C_{17}$);
   the twelfth switch ($S_{12}$) has a first terminal connected to a positive reference voltage ($V_{rp}$), and a second terminal connected to the lower plates of the twelfth, fourteenth, sixteenth and eighteenth capacitors ($C_{12}$, $C_{14}$, $C_{16}$ and $C_{18}$);
   the fourteenth switch ($S_{14}$) has a first terminal connected to the output terminal of the image sensor, and a second terminal connected to the lower plates of the eleventh, thirteenth, fifteenth and seventeenth capacitors ($C_{11}$, $C_{13}$, $C_{15}$ and $C_{17}$),
   the sixteenth switch ($S_{16}$) has a first terminal connected to the negative output terminal ($V_{on}$) of the operational amplifier, and a second terminal connected to the lower plates of the twelfth, fourteenth, sixteenth and eighteenth capacitors ($C_{12}$, $C_{14}$, $C_{16}$ and $C_{18}$);
   the seventeenth switch ($S_{17}$) has a first terminal connected to a common-mode voltage ($V_{CM}$), the positive reference voltage ($V_{rp}$), the negative reference voltage ($V_{rn}$), and the negative input terminal ($V_{in}$) of the operational amplifier, and a second terminal connected to a lower plate of the twenty-first capacitor ($C_{21}$);
   the eighteenth switch ($S_{18}$) has a first terminal connected to the common-mode voltage ($V_{CM}$), the positive reference voltage ($V_{rp}$), the negative reference voltage ($V_{rn}$), and the negative input terminal ($V_{in}$) of the operational amplifier, and a second terminal connected to a lower plate of the twenty-second capacitor ($C_{22}$);
   the nineteenth switch ($S_{19}$) has a first terminal connected to an upper plate of the twenty-first capacitor ($C_{21}$), and a second terminal connected to the common-mode voltage ($V_{CM}$), the positive output terminal ($V_{op}$) of the operational amplifier, and the negative input terminal ($V_{in}$) of the operational amplifier;
   the twentieth switch ($S_{20}$) has a first terminal connected to an upper plate of the twenty-second capacitor ($C_{22}$), and a second terminal connected to the common-mode voltage ($V_{CM}$), the negative output terminal ($V_{on}$) of the operational amplifier, and the positive input terminal ($V_{ip}$) of the operational amplifier;

the twenty-first switch ($S_{21}$) has a first terminal connected to an upper plate of the eleventh capacitor ($C_{11}$), and a second terminal connected to the common-mode voltage ($V_{CM}$), the positive reference voltage ($V_{rp}$), and the negative reference voltage ($V_{rn}$), the twenty-third switch ($S_{23}$) has a first terminal connected to an upper plate of the thirteenth capacitor ($C_{13}$), and a second terminal connected to the common-mode voltage ($V_{CM}$), the positive reference voltage ($V_{rp}$), and the negative reference voltage ($V_{rn}$);

the twenty-fifth switch ($S_{25}$) has a first terminal connected to an upper plate of the fifteenth capacitor ($C_{15}$), and a second terminal connected to the common-mode voltage ($V_{CM}$), the positive reference voltage ($V_{rp}$), and the negative reference voltage ($V_{rn}$);

the twenty-seventh switch ($S_{27}$) has a first terminal connected to an upper plate of the seventeenth capacitor ($C_{17}$), and a second terminal connected to the common-mode voltage ($V_{CM}$), the positive reference voltage ($V_{rp}$), and the negative reference voltage ($V_{rn}$);

the twenty-second switch ($S_{22}$) has a first terminal connected to an upper plate of the twelfth capacitor ($C_{12}$), and a second terminal connected to the common-mode voltage ($V_{CM}$), the positive reference voltage ($V_{rp}$), and the negative reference voltage ($V_{rn}$);

the twenty-fourth switch ($S_{24}$) has a first terminal connected to an upper plate of the fourteenth capacitor ($C_{14}$), and a second terminal connected to the common-mode voltage ($V_{CM}$), the positive reference voltage ($V_{rp}$), and the negative reference voltage ($V_{rn}$);

the twenty-sixth switch ($S_{26}$) has a first terminal connected to an upper plate of the sixteenth capacitor ($C_{16}$), and a second terminal connected to the common-mode voltage ($V_{CM}$), the positive reference voltage ($V_{rp}$), and the negative reference voltage ($V_{rn}$);

the twenty-eighth switch ($S_{28}$) has a first terminal connected to an upper plate of the eighteenth capacitor ($C_{18}$), and a second terminal connected to the common-mode voltage ($V_{CM}$), the positive reference voltage ($V_{rp}$), and the negative reference voltage ($V_{rn}$);

the twenty-ninth switch ($S_{29}$) has a first terminal connected to the positive input terminal ($V_{ip,comp}$) of the voltage comparator, and a second terminal connected to the lower plates of the eleventh, thirteenth, fifteenth and seventeenth capacitors ($C_{11}$, $C_{13}$, $C_{15}$ and $C_{17}$);

the thirtieth switch ($S_{30}$) has a first terminal connected to the negative input terminal ($V_{in,comp}$) of the voltage comparator, and a second terminal connected to the lower plates of the twelfth, fourteenth, sixteenth and eighteenth capacitors ($C_{12}$, $C_{14}$, $C_{16}$ and $C_{18}$);

the thirty-first switch ($S_{31}$) has a first terminal connected to the lower plates of the eleventh, thirteenth, fifteenth and seventeenth capacitors ($C_{11}$, $C_{13}$, $C_{15}$ and $C_{17}$), and a second terminal connected to the negative input terminal ($V_{in}$) of the operational amplifier;

the thirty-second switch ($S_{32}$) has a first terminal connected to the lower plates of the twelfth, fourteenth, sixteenth and eighteenth capacitors ($C_{12}$, $C_{14}$, $C_{16}$ and $C_{18}$), and a second terminal connected to the positive input terminal ($V_{ip}$) of the operational amplifier;

the thirty-third switch ($S_{33}$) has a first terminal connected to the positive output terminal ($V_{op}$) of the operational amplifier, and a second terminal connected to the positive input terminal ($V_{ip,comp}$) of the voltage comparator;

the thirty-fourth switch ($S_{34}$) has a first terminal connected to the negative output terminal ($V_{on}$) of the operational amplifier, and a second terminal connected to the negative input terminal ($V_{in,comp}$) of the voltage comparator;

the thirty-fifth switch ($S_{36}$) has a first terminal connected to second terminals of the forty-first, forty-third, forty-fifth, forty-seventh and forty-ninth switches ($S_{41}$, $S_{43}$, $S_{45}$, $S_{47}$ and $S_{49}$), and a second terminal connected to the positive input terminal ($V_{ip,comp}$) of the comparator;

the thirty-sixth switch ($S_{35}$) has a first terminal connected to second terminals of the forty-second, forty-fourth, forty-sixth, forty-eighth and fortieth switches ($S_{42}$, $S_{44}$, $S_{46}$, $S_{48}$ and $S_{40}$), and a second terminal connected to the negative input terminal ($V_{in,comp}$) of the comparator;

the forty-first switch ($S_{41}$) has a first terminal connected to a lower plate of the thirty-first capacitor ($C_{31}$) and a second terminal connected to the first terminal of the thirty-fifth switch ($S_{35}$);

the forty-third switch ($S_{43}$) has a first terminal connected to a lower plate of the thirty-third capacitor ($C_{33}$) and a second terminal connected to the first terminal of the thirty-fifth switch ($S_{35}$);

the forty-fifth switch ($S_{45}$) has a first terminal connected to a lower plate of the thirty-fifth capacitor ($C_{35}$) and a second terminal connected to the first terminal of the thirty-fifth switch ($S_{35}$);

the forty-seventh switch ($S_{47}$) has a first terminal connected to a lower plate of the thirty-seventh capacitor ($C_{37}$) and a second terminal connected to the first terminal of the thirty-fifth switch ($S_{35}$), the forty-ninth switch ($S_{49}$) has a first terminal connected to the negative input terminal ($V_{in}$) of the operational amplifier and a second terminal connected to the first terminal of the thirty-fifth switch ($S_{35}$);

the forty-second switch ($S_{42}$) has a first terminal connected to a lower plate of the thirty-second capacitor ($C_{32}$) and a second terminal connected to the first terminal of the thirty-sixth switch ($S_{36}$);

the forty-fourth switch ($S_{44}$) has a first terminal connected to a lower plate of the thirty-fourth ccapacitor ($C_{34}$) and a second terminal connected to the first terminal of the thirty-sixth switch ($S_{36}$), the forty-sixth switch ($S_{42}$) has a first terminal connected to a lower plate of the thirty-sixth capacitor ($C_{36}$) and a second terminal connected to the first terminal of the thirty-sixth switch ($S_{36}$);

the forty-eighth switch ($S_{48}$) has a first terminal connected to a lower plate of the thirty-eighth capacitor ($C_{38}$) and a second terminal connected to the first terminal of the thirty-sixth switch ($S_{36}$);

the fortieth switch ($S_{40}$) has a first terminal connected to the positive input terminal ($V_{ip}$) of the operational amplifier and a second terminal connected to the first terminal of the thirty-sixth switch ($S_{36}$);

the fifty-first switch ($S_{51}$) has a first terminal connected to the negative input terminal ($V_{in}$) of the operational amplifier, the negative reference voltage ($V_{rn}$), and the positive reference voltage ($V_{rp}$), and a second terminal connected to an upper plate of the thirty-first capacitor ($C_{31}$);

the fifty-third switch ($S_{53}$) has a first terminal connected to the negative input terminal ($V_{in}$) of the operational amplifier, the negative reference voltage ($V_{rn}$), and the positive reference voltage ($V_{rp}$), and a second terminal connected to an upper plate of the thirty-third capacitor ($C_{33}$);

the fifty-fifth switch ($S_{55}$) has a first terminal connected to the negative input terminal ($V_{in}$) of the operational amplifier, the negative reference voltage ($V_{rn}$), and the positive reference voltage ($V_{rp}$), and a second terminal connected to an upper plate of the thirty-fifth capacitor ($C_{35}$);

the fifty-seventh switch ($S_{57}$) has a first terminal connected to the negative input terminal ($V_{in}$) of the operational amplifier, the negative reference voltage ($V_{rn}$), and the positive reference voltage ($V_{rp}$), and a second terminal connected to an upper plate of the thirty-seventh capacitor ($C_{37}$);

the fifty-second switch ($S_{52}$) has a first terminal connected to the positive input terminal ($V_{ip}$) of the operational amplifier, the negative reference voltage ($V_{rn}$), and the positive reference voltage ($V_{rp}$), and a second terminal connected to an upper plate of the thirty-second capacitor ($C_{32}$);

the fifty-fourth switch ($S_{54}$) has a first terminal connected to the positive input terminal ($V_{ip}$) of the operational amplifier, the negative reference voltage ($V_{rn}$), and the positive reference voltage ($V_{rp}$), and a second terminal connected to an upper plate of the thirty-fourth capacitor ($C_{34}$);

the fifty-sixth switch ($S_{56}$) has a first terminal connected to the positive input terminal ($V_{ip}$) of the operational amplifier, the negative reference voltage ($V_{rn}$), and the positive reference voltage ($V_{rp}$), and a second terminal connected to an upper plate of the thirty-sixth capacitor ($C_{36}$); and the fifty-eighth switch ($S_{58}$) has a first terminal connected to the positive input terminal ($V_{ip}$) of the operational amplifier, the negative reference voltage ($V_{rn}$), and the positive reference voltage ($V_{rp}$), and a second terminal connected to an upper plate of the thirty-eighth capacitor ($C_{38}$).

3. The analog readout preprocessing circuit for a solid state CMOS image sensor according to claim 2, wherein the eleventh capacitor through the eighteenth capacitor ($C_{11}$, $C_{12}$, $C_{13}$, $C_{14}$, $C_{15}$, $C_{16}$, $C_{17}$ and $C_{18}$), the twenty-first capacitor through the twenty-second capacitor ($C_{21}$ and $C_{22}$), the thirty-first capacitor through the thirty-eighth capacitor ($C_{31}$, $C_{32}$, $C_{33}$, $C_{34}$, $C_{35}$, $C_{36}$, $C_{37}$ and $C_{38}$), the eleventh switch through the fourteenth switch ($S_{11}$, $S_{12}$, $S_{13}$ and $S_{14}$), the seventeenth switch through the twenty-eighth switch ($S_{17}$, $S_{18}$, $S_{19}$, $S_{20}$, $S_{21}$, $S_{22}$, $S_{23}$, $S_{24}$, $S_{25}$, $S_{26}$, $S_{27}$ and $S_{28}$), the thirty-first switch through the thirty-sixth switch ($S_{31}$, $S_{32}$, $S_{33}$, $S_{34}$, $S_{35}$ and $S_{36}$), the forty-first switch through the fifty-eighth switch ($S_{41}$, $S_{42}$, $S_{43}$, $S_{44}$, $S_{45}$, $S_{46}$, $S_{47}$, $S_{49}$, $S_{51}$, $S_{50}$, $S_{51}$, $S_{52}$, $S_{53}$, $S_{54}$, $S_{55}$, $S_{56}$, $S_{57}$ and $S_{58}$) in the extended count-type integration cycle-successive approximation hybrid analog-to-digital conversion capacitor network constitutes an extended count-type integrator along with the operational amplifier and the voltage comparator.

4. The analog readout preprocessing circuit for a solid state CMOS image sensor according to claim 1, wherein the signals acquired by the extended count-type integration cycle-successive approximation hybrid analog-to-digital conversion capacitor network comprises: a reset signal ($V_{rst}$) and a light intensity signal ($V_{sig}$) inputted from the image sensor, and a first reference voltage ($V_{rn}$) and a first reference voltage ($V_{rp}$) from an external reference voltage source; and the extended count-type integration cycle-successive approximation hybrid analog-to-digital conversion capacitor network preprocesses the acquired signals, including at least removing noises of the acquired signals and integrating an effective light intensity signal ($V_{RST}$-$V_{SIG}$).

5. The analog readout preprocessing circuit for a solid state CMOS image sensor according to claim 1, wherein the operational amplifier comprises a zeroth transistor through a tenth transistor ($M_0$~$M_{10}$) and a bias and common-mode feedback generation circuit; wherein the bias and common-mode feedback generation circuit is configured to generate bias voltages ($V_{BP1}$, $V_{BP2}$, and $V_{BN}$) and a common-mode feedback voltage ($V_{CMFB}$);

the zeroth transistor ($M_0$) has a gate connected to the bias voltage ($V_{BP1}$), and a source connected to a power supply ($V_{DD}$);

the first transistor ($M_1$) has a gate connected to the positive input terminal ($V_{ip}$) of the operational amplifier, a source connected to a drain of the zeroth transistor ($M_0$), and a drain connected to a source of the seventh transistor ($M_7$) and a drain of the ninth transistor ($M_9$);

the second transistor ($M_2$) has a gate connected to the negative input terminal ($V_{in}$) of the operational amplifier, a source connected to the drain of the zeroth transistor ($M_0$), and a drain connected to a source of the eighth transistor ($M_8$) and a drain of the tenth transistor ($M_{10}$);

the third transistor ($M_3$) has a gate connected to the bias voltage ($V_{BP1}$), a source connected to the power supply ($V_{DD}$), and a drain connected to a source of the fifth transistor ($M_5$);

the fourth transistor ($M_4$) has a gate connected to the bias voltage ($V_{BP1}$), a source connected to the power supply ($V_{DD}$), and a drain connected to a source of the sixth transistor ($M_6$);

the fifth transistor ($M_5$) has a gate connected to the bias voltage ($V_{BP2}$), and a drain connected to a drain of the seventh transistor ($M_7$) and the negative output terminal ($V_{on}$) of the operational amplifier;

the sixth transistor ($M_6$) has a gate connected to the bias voltage ($V_{BP2}$), and a drain connected to a drain of the eighth transistor ($M_8$) and the positive output terminal ($V_{op}$) of the operational amplifier;

the seventh transistor ($M_7$) has a gate connected to the bias voltage ($V_{BN}$);

the eighth transistor ($M_8$) has a gate connected to the bias voltage ($V_{BN}$);

the ninth transistor ($M_9$) has a gate connected to the common-mode feedback voltage ($V_{CMFB}$), and a source connected to the ground (Vss);

the tenth transistor ($M_{10}$) has a gate connected to the common-mode feedback voltage ($V_{CMFB}$), and a source connected to the ground (Vss).

6. The analog readout preprocessing circuit for a solid state CMOS image sensor according to claim 1, wherein the voltage comparator comprises a twentieth transistor through a thirty-first transistor ($M_{20}$~$M_{31}$); wherein the twentieth transistor ($M_{20}$) has a gate connected to an enabling signal (EN), and a source connected to the ground (GND);

the twenty-first transistor ($M_{21}$) has a gate connected to the positive input terminal ($V_{ip,cmp}$) of the voltage comparator, a source connected to a drain of the twentieth transistor ($M_{20}$), and a drain connected to a drain of the twenty-third transistor ($M_{23}$) and a gate of the twenty-eighth transistor ($M_{28}$);

the twenty-second transistor ($M_{22}$) has a gate connected to the negative input terminal ($V_{in,cmp}$) of the voltage comparator, a source connected to the drain of the twentieth transistor ($M_{20}$), and a drain connected to a drain of the twenty-fourth transistor ($M_{24}$) and a gate of the thirty-first transistor ($M_{31}$);

the twenty-third transistor ($M_{23}$) has a gate connected to the enabling signal (EN), a source connected to the power supply ($V_{DD}$), and a drain connected to the drain of the twenty-first transistor ($M_{21}$) and the gate of the twenty-eighth transistor ($M_{28}$);

the twenty-fourth transistor ($M_{24}$) has a gate connected to the enabling signal (EN), a source connected to the power supply ($V_{DD}$), and a drain connected to the drain of the twenty-second transistor ($M_{22}$) and the gate of the thirty-first transistor ($M_{31}$);

the twenty-fifth transistor ($M_{25}$) has a gate connected to an inverted signal ($\overline{EN}$) of the enabling signal (EN), a source connected to the power supply $V_{DD}$, and a drain connected to sources of the twenty-sixth transistor and the twenty-seventh transistor ($M_{26}$ and $M_{27}$);

the twenty-sixth transistor ($M_{26}$) has a gate connected to a drain of the twenty-seventh transistor ($M_{27}$) and a gate of the twenty-ninth transistor ($M_{29}$), and a drain connected to gates of the twenty-seventh and thirtieth transistors ($M_{27}$ and $M_{30}$), drains of the twenty-eighth and twenty-ninth transistors ($M_{28}$ and $M_{29}$) and the output terminal ($V_{cmpo}$) of the voltage comparator;

the twenty-seventh transistor ($M_{27}$) has a gate connected to the drain of the twenty-sixth transistor ($M_{26}$) and the gate of the thirtieth transistor ($M_{30}$), and a drain connected to the gates of the twenty-sixth and twenty-ninth transistors ($M_{26}$ and $M_{29}$) and drains of the thirtieth and thirty-first transistors ($M_{30}$ and $M_{31}$);

the twenty-eighth transistor ($M_{28}$) has a source connected the ground (GND);

the twenty-ninth transistor ($M_{29}$) has a source connected the ground (GND);

the thirtieth transistor ($M_{30}$) has a source connected the ground (GND); and the thirty-first transistor ($M_{31}$) has a source connected the ground (GND).

7. The analog readout preprocessing circuit for a solid state CMOS image sensor according to claim 1, wherein the control signals provided from the control signal generator comprises control signals for the eleventh switch through the twenty-eighth switch ($S_{11}$, $S_{12}$, $S_{13}$, $S_{14}$, $S_{15}$, $S_{16}$, $S_{17}$, $S_{18}$, $S_{19}$, $S_{20}$, $S_{21}$, $S_{22}$, $S_{23}$, $S_{24}$, $S_{25}$, $S_{26}$, $S_{27}$ and $S_{28}$), the forty-first switch through the forty-eighth switch ($S_{41}$, $S_{42}$, $S_{43}$, $S_{44}$, $S_{45}$, $S_{46}$, $S_{47}$ and $S_{48}$) and the fifty-first switch through the fifty-eighth switch ($S_{51}$, $S_{52}$, $S_{53}$, $S_{54}$, $S_{55}$, $S_{56}$, $S_{57}$ and $S_{58}$), and control signals for the accumulator, the first latch and the second latch.

8. A control method for an analog readout preprocessing circuit according to claim 1, comprising:

step A where the extended count-type integrator samples a reset signal output from the image sensor;

step B where the extended count-type integrator integrates the reset signal output from the image sensor for the first time after the sampling operation, and transfers the sampled signal to an integrating capacitor to reduce noise power of the reset signal;

step C where the reset signal output from the image sensor is integrated fifteen times after the integration for the first time;

step D where an effective light intensity signal output from the image sensor is integrated another sixteen times after the reset signal output from the image sensor has been integrated sixteen times;

step E where first cycle-successive approximation hybrid analog-to-digital conversion is performed on a difference ($V_{op}$–$V_{on}$) of $V_{op}$ and $V_{on}$ at the output terminals of the amplifier after the integrations of the reset signal and the effective light intensity signal have completed;

step F where a first cycle operation is performed after the first cycle-successive approximation hybrid analog-to-digital conversion;

step G where second cycle-successive approximation hybrid analog-to-digital conversion is performed after the first cycle operation; and step H where the digital processor synthesizes digital signals output from the accumulator, the first latch and the second latch to obtain a final digital signal corresponding to the effective light intensity signal output from the image sensor.

9. The control method for an analog readout preprocessing circuit according to claim 8, wherein step A where the extended count-type integrator samples a reset signal output from the image sensor further comprises: causing the eleventh switch ($S_{11}$) and the twelfth switch ($S_{12}$) to turn on, causing the second terminals of the twenty-first, twenty-third, twenty-fifth and twenty-seventh switches ($S_{21}$, $S_{23}$, $S_{25}$ and $S_{27}$) to connect to the common-mode voltage ($V_{CM}$), the second terminals of the twenty-second, twenty-fourth, twenty-sixth and twenty-eighth switches ($S_{22}$, $S_{24}$, $S_{26}$ and $S_{28}$) to connect to the common-mode voltage ($V_{CM}$); causing the thirteenth switch ($S_{13}$), the fifteenth switch ($S_{15}$), the fourteenth switch ($S_{14}$) and the sixteenth switch ($S_{16}$) to turn off; causing the twenty-ninth, thirtieth, thirty-first and thirty-second switches ($S_{29}$, $S_{30}$, $S_{31}$ and $S_{32}$) to turn off; causing the first terminals of the seventeenth, eighteenth, nineteenth and twentieth switches ($S_{17}$, $S_{18}$, $S_{19}$, and $S_{20}$) to connect to the common-mode voltage ($V_{CM}$); causing the thirty-third, thirty-fourth, thirty-fifth and thirty-sixth switches ($S_{33}$, $S_{34}$, $S_{35}$ and $S_{36}$), the forty-first, forty-third, forty-fifth, forty-seventh and forty-ninth switches ($S_{41}$, $S_{43}$, $S_{45}$, $S_{47}$ and $S_{49}$) and the forty-second, forty-fourth, forty-sixth, forty-eighth and fortieth switches ($S_{42}$, $S_{44}$, $S_{46}$, $S_{48}$ and $S_{40}$) to turn on; causing the first terminals of the fifty-first, fifty-third, fifty-fifth and fifty-seventh switches ($S_{51}$, $S_{53}$, $S_{55}$ and $S_{57}$) to connect to the negative input terminal ($V_{in}$) of the operational amplifier; causing the fifty-second, fifty-fourth, fifty-sixth and fifty-eighth switches ($S_{52}$, $S_{54}$, $S_{56}$ and $S_{58}$) to connect to the positive input terminal ($V_{ip}$) of the operational amplifier; and causing the accumulator to clear.

10. The control method for an analog readout preprocessing circuit according to claim 8, wherein the integrating capacitor involved in step B comprises an upper integrating capacitor and a lower integrating capacitor; wherein the upper integrating capacitor comprises a thirty-first capacitor ($C_{31}$), a thirty-third capacitor ($C_{33}$), a thirty-fifth capacitor ($C_{35}$) and a thirty-seventh capacitor ($C_{37}$), and the lower integrating capacitor comprises a thirty-second capacitor ($C_{32}$), a thirty-fourth capacitor ($C_{34}$), a thirty-sixth capacitor ($C_{36}$) and a thirty-eighth capacitor ($C_{38}$).

11. The control method for an analog readout preprocessing circuit according to claim 8, wherein step B where the extended count-type integrator integrates the reset signal output from the image sensor for the first time further comprises: causing the eleventh and twelfth switches ($S_{11}$ and $S_{12}$) to turn off; causing the forty-ninth and fortieth switches ($S_{49}$ and $S_{40}$) to turn off; causing the thirty-first and thirty-second switches ($S_{31}$ and $S_{32}$) to turn on; causing the second terminal of the nineteenth switch ($S_{19}$) to connect to the negative input terminal ($V_{in}$) of the operational amplifier; comparing, by the voltage comparator, the voltage ($V_{ip,cmp}$) at the positive input terminal and the voltage ($V_{in,cmp}$) at the negative input terminal, and outputting, at the output terminal ($V_{cmpo}$) of the voltage comparator, a logic high level if the voltage ($V_{ip,cmp}$) at the positive input terminal is higher than the voltage ($V_{in,cmp}$) at the negative input terminal, and a logic low level if the voltage ($V_{ip,cmp}$) at the positive input terminal is lower than the voltage ($V_{in,cmp}$) at the negative input terminal; causing the first terminal of the seventeenth switch ($S_{17}$) to connect to the positive reference voltage ($V_{rp}$) if a logic high level is output at the output terminal ($V_{cmpo}$) of the voltage comparator, and causing the first terminal of the seventeenth switch ($S_{17}$) to connect to the positive reference voltage ($V_{rp}$) if a logic low level is output at the output terminal ($V_{cmpo}$) of the voltage comparator; causing the first terminal of the eighteenth switch ($S_{18}$) to connect to the negative reference voltage ($V_{rn}$) if a logic high level is output at the output terminal ($V_{cmpo}$) of the voltage comparator, and causing the first terminal of the eighteenth switch ($S_{18}$) to connect to the negative reference voltage ($V_{rn}$) if a logic low level is output at the output terminal ($V_{cmpo}$) of the voltage comparator; causing the second terminals of the twenty-first through twenty-eighth switches ($S_{21}$ through $S_{28}$) to connect to the common-mode voltage ($V_{CM}$); and accumulating, by the accumulator, the output of the voltage comparator with its original value.

12. The control method for an analog readout preprocessing circuit according to claim 8, wherein step C where the reset signal output from the image sensor is integrated fifteen times after the integration for the first time comprises performing step A and step B sequentially for fifteen times, where the forty-ninth and fortieth switches are turned off each time step A is performed.

13. The control method for an analog readout preprocessing circuit according to claim 8, wherein step where the effective light intensity signal output from the image sensor is integrated another sixteen times comprises performing steps A, B and C sequentially for sixteen times in which the reset signal is replaced with the effective light intensity signal, where the thirteenth and fourteenth switches are turned on, the eleventh and twelfth switches are turned off and the forty-ninth and fortieth switches are turned off each time step A is performed.

14. The control method for an analog readout preprocessing circuit according to claim 8, wherein the first cycle-successive approximation hybrid analog-to-digital conversion of step E is performed by the following elements: the eleventh capacitor through the eighteenth capacitor ($C_{11}$, $C_{12}$, $C_{13}$, $C_{14}$, $C_{15}$, $C_{16}$, $C_{17}$ and $C_{18}$), the twenty-first capacitor through the twenty-second capacitor ($C_{21}$ and $C_{22}$), the thirty-first capacitor through the thirty-eighth capacitor ($C_{31}$, $C_{32}$, $C_{33}$, $C_{34}$, $C_{35}$, $C_{36}$, $C_{37}$ and $C_{38}$), the fifteenth and sixteenth switches ($S_{15}$, $S_{16}$), the seventeenth switch through the twenty-eighth switch ($S_{17}$, $S_{18}$, $S_{19}$, $S_{20}$, $S_{21}$, $S_{22}$, $S_{23}$, $S_{24}$, $S_{25}$, $S_{26}$, $S_{27}$ and $S_{28}$), the thirty-first switch through the thirty-fourth switch ($S_{31}$, $S_{32}$, $S_{33}$ and $S_{34}$), the forty-first through the fifty-eighth switch ($S_{41}$, $S_{42}$, $S_{43}$, $S_{44}$, $S_{45}$, $S_{46}$, $S_{47}$, $S_{49}$, $S_{51}$, $S_{50}$, $S_{51}$, $S_{52}$, $S_{53}$, $S_{54}$, $S_{55}$, $S_{56}$, $S_{57}$ and $S_{58}$); the operational amplifier and the voltage comparator, wherein a resolution of the analog-to-digital conversion is 4 bits.

15. The control method for an analog readout preprocessing circuit according to claim 8, wherein the first cycle-successive approximation hybrid analog-to-digital conversion of step E further comprises: causing the thirty-third and thirty-fourth switches to turn off; comparing, by the voltage comparator, the voltage ($V_{ip,cmp}$) at the positive input terminal and the voltage ($V_{in,cmp}$) at the negative input terminal, and outputting at the output terminal ($V_{cmpo}$) of the voltage comparator, a logic high level if the voltage ($V_{ip,cmp}$) at the positive input terminal is higher than the voltage ($V_{in,cmp}$) at the negative input terminal, and a logic low level if the voltage ($V_{ip,cmp}$) at the positive input terminal is lower than the voltage ($V_{in,cmp}$) at the negative input terminal; causing the first terminal of the fifty-first switch ($S_{51}$) to connect to the negative reference voltage ($V_{rn}$) and the first terminal of the fifty-second switch ($S_{52}$) to connect to the positive reference voltage ($V_{rp}$) if a logic high level is output at the output terminal ($V_{cmpo}$) of the voltage comparator, and causing the first terminal of the fifty-first switch ($S_{51}$) to connect to the positive reference voltage ($V_{rp}$) and the first terminal of the fifty-second switch ($S_{52}$) to connect to the negative reference voltage ($V_{rn}$) if a logic low level is output at the output terminal ($V_{cmpo}$) of the voltage comparator; comparing, by the voltage comparator, the voltage ($V_{ip,cmp}$) at the positive input terminal and the voltage ($V_{in,cmp}$) at the negative input terminal continuously; causing the first terminal of the fifty-third switch ($S_{53}$) to connect to the negative reference voltage ($V_{rn}$) and the first terminal of the fifty-fourth switch ($S_{54}$) to connect to the positive reference voltage ($V_{rp}$) if a logic high level is output at the output terminal ($V_{cmpo}$) of the voltage comparator; causing the first terminal of the fifty-third switch ($S_{53}$) to connect to the positive reference voltage ($V_{rp}$) and the first terminal of the fifty-fourth switch ($S_{54}$) to connect to the negative reference voltage ($V_{rn}$) if a logic low level is output at the output terminal ($V_{cmpo}$) of the voltage comparator; further executing the foregoing steps twice until connections of the first terminals of the fifty-fifth, fifty-seventh, fifty-sixth and the fifty-eighth switches ($S_{55}$, $S_{57}$, $S_{56}$ and $S_{58}$) have been determined; and storing comparison results from the four comparisons of the voltage comparator in a latch.

16. The control method for an analog readout preprocessing circuit according to claim 8, wherein the first cycle operation of step F further comprises: causing the thirty-first and thirty-second switches ($S_{31}$ and $S_{32}$) to turn off; causing the forty-ninth and fortieth switches ($S_{49}$ and $S_{40}$) to turn on; causing the first terminal of the seventeenth switch ($S_{17}$) to connect to the negative input terminal ($V_{in}$) of the operational amplifier; causing the second terminal of the nineteenth switch ($S_{19}$) to connect to the positive output terminal ($V_{op}$) of the operational amplifier; causing the first terminal of the eigteenth switch ($S_{18}$) to connect to the positive input terminal ($V_{ip}$) of the operation amplifier; causing the second terminal of the twentieth switch ($S_{20}$) to connect to the negative output terminal ($V_{on}$) of the operational amplifier; causing the thirty-third and thirty-fourth switches ($S_{33}$ and $S_{34}$) to turn on; causing the twenty-ninth and thirtieth switches ($S_{29}$ and $S_{30}$) to connect to the positive input terminal ($V_{ip,pcmp}$) and the negative input terminal ($V_{ip,cmp}$) of the voltage comparator, respectively; and causing the fifteenth and sixteenth switches ($S_{15}$ and $S_{16}$) to turn on.

17. The control method for an analog readout preprocessing circuit according to claim 8, wherein the second cycle-successive approximation hybrid analog-to-digital conversion of step G further comprises: causing the thirty-third and thirty-fourth switches ($S_{33}$ and $S_{34}$) to turn off; comparing, by the voltage comparator, the voltage ($V_{ip,cmp}$) at the positive input terminal and the voltage ($V_{in,cmp}$) at the negative input terminal, and outputting, at the output terminal ($V_{cmpo}$) of the voltage comparator, a logic high level if the voltage ($V_{ip,cmp}$) at the positive input terminal is higher than the voltage ($V_{in,cmp}$) at the negative input terminal, and a logic low level if the voltage ($V_{ip,cmp}$) at the positive input terminal is lower than the voltage ($V_{in,cmp}$) at the negative input terminal; causing the first terminal of the twenty-first switch ($S_{21}$) to connect to the negative reference voltage ($V_{rn}$) and the first terminal of the twenty-second switch ($S_{22}$) to connect to the positive reference voltage ($V_{rp}$) if a logic high level is output at the output terminal ($V_{cmpo}$) of the voltage comparator, and causing the first terminal of the twenty-first switch ($S_{21}$) to connect to the positive reference voltage ($V_{rp}$) and the first terminal of the twenty-second switch ($S_{22}$) to connect to the negative reference voltage ($V_{rn}$) if a logic low level is output at the output terminal ($V_{cmpo}$) of the voltage comparator; comparing, by the voltage comparator, the voltage ($V_{ip,cmp}$) at the positive input terminal and the voltage ($V_{in,cmp}$) at the negative input terminal continuously; causing the first terminal of the twenty-third switch ($S_{23}$) to connect to the negative reference voltage ($V_{rn}$) and the first terminal of the twenty-fourth switch ($S_{24}$) to connect to the positive reference voltage ($V_{rp}$) if a logic high level is output at the output terminal ($V_{cmpo}$) of the voltage comparator; causing the first terminal of the twenty-third switch ($S_{23}$) to connect to the positive reference voltage ($V_{rp}$) and the first terminal of the twenty-fourth switch ($S_{24}$) to connect to the negative reference voltage ($V_{rn}$) if a logic low level is output at the output terminal ($V_{cmpo}$) of the voltage comparator; further executing the foregoing steps twice until the connections of the first terminals of the twenty-fifth, twenty-seventh, twenty-sixth and the twenty-eighth switches ($S_{25}$, $S_{27}$, $S_{26}$ and $S_{28}$) have been determined; and storing comparison results from the four comparisons of the voltage comparator in a latch.

\* \* \* \* \*